(12) United States Patent
Tao

(10) Patent No.: US 7,699,582 B2
(45) Date of Patent: Apr. 20, 2010

(54) FAN MODULE

(75) Inventor: Lang Tao, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 739 days.

(21) Appl. No.: 11/309,927

(22) Filed: Oct. 27, 2006

(65) Prior Publication Data

US 2008/0101019 A1 May 1, 2008

(51) Int. Cl.
*H05K 7/20* (2006.01)

(52) U.S. Cl. .................................. 415/213.1; 415/220

(58) Field of Classification Search ................. 415/220, 415/213.1, 214.1, 160, 118
See application file for complete search history.

(56) References Cited

U.S. PATENT DOCUMENTS

| | | | |
|---|---|---|---|
| 6,435,889 B1 * | 8/2002 | Vinson et al. | 439/247 |
| 6,556,437 B1 * | 4/2003 | Hardin | 361/679.48 |
| 6,808,411 B2 | 10/2004 | Chen | |
| 6,999,313 B2 | 2/2006 | Shih | |
| 2004/0145881 A1 * | 7/2004 | Kosugi | 361/810 |
| 2005/0105271 A1 * | 5/2005 | Lu et al. | 361/695 |

* cited by examiner

*Primary Examiner*—Edward Look
*Assistant Examiner*—Jesse Prager
(74) *Attorney, Agent, or Firm*—Wei Te Chung

(57) ABSTRACT

A fan module includes a fan (10), a bracket (20), and a locking member (30). The fan includes a pair of parallel side walls (12) each defining through holes (122) therein. The bracket includes a pair of parallel side plates (26) for securing the fan therebetween. The side plates are perpendicular to the side walls of the fan. A locking hole (262) is defined in one of the side plates. The locking member is sandwiched between the fan and one of the side plates of the bracket, and has a resilient arm (322) and two pairs of resilient posts (326) inserting between the side walls of the fan. A protrusion (3262) is formed on each post and removably engages in the corresponding through holes of each side wall of the fan. A locking tab (3222) protrudes from the resilient arm and detachably engages in the locking hole of the bracket.

17 Claims, 5 Drawing Sheets

FAN MODULE

FIELD OF THE INVENTION

The present invention relates to fan modules, and more particularly to a fan module of a computer system.

DESCRIPTION OF RELATED ART

In a working computer system, a large amount of heat is generated from electric elements of the computer system. If the heat is not dissipated timely, the electric elements may be damaged. So, heat dissipating devices are desired.

A fan is often used as a conventional means to dissipate the heat in the computer system. In this conventional means, a bracket is provided for receiving the fan, and a plurality of through holes is defined in the bracket. In installing the fan to a plate of the computer system, the fan is received into the bracket. The bracket together with the fan is placed on the plate, which defines a plurality of screw holes therein. The through holes of the bracket align with the screw holes of the plate. The fan is enclosed by the bracket and the plate. A plurality of screws extends through the through holes and is screwed into the corresponding screw holes. The fan is thereby secured to the plate of the computer system. In this mounting means, it is well known that assembly and disassembly of the fans is very inconvenient.

What is needed, therefore, is a mounting apparatus for conveniently assembling and disassembling a fan in a computer system.

SUMMARY OF THE INVENTION

A fan module includes a fan, a bracket, and a locking member. The fan includes a pair of parallel side walls each defining at least one through hole therein. The bracket includes a pair of parallel side plates for securing the fan therebetween. The side plates are perpendicular to the side walls of the fan. A locking hole is defined in one of the side plates. The locking member is sandwiched between the fan and one of the side plates of the bracket, and has a resilient arm and at least one pair of resilient posts inserting between the side walls of the fan. A protrusion is formed on each post and removably engages into the at least one through hole of each side wall of the fan. A locking tab protrudes from the resilient arm and detachably engages in the locking hole of the side plate of the bracket.

Other advantages and novel features will be drawn from the following detailed description of preferred embodiments with attached drawings, in which:

DETAILED DESCRIPTION OF THE INVENTION

Figure 1:
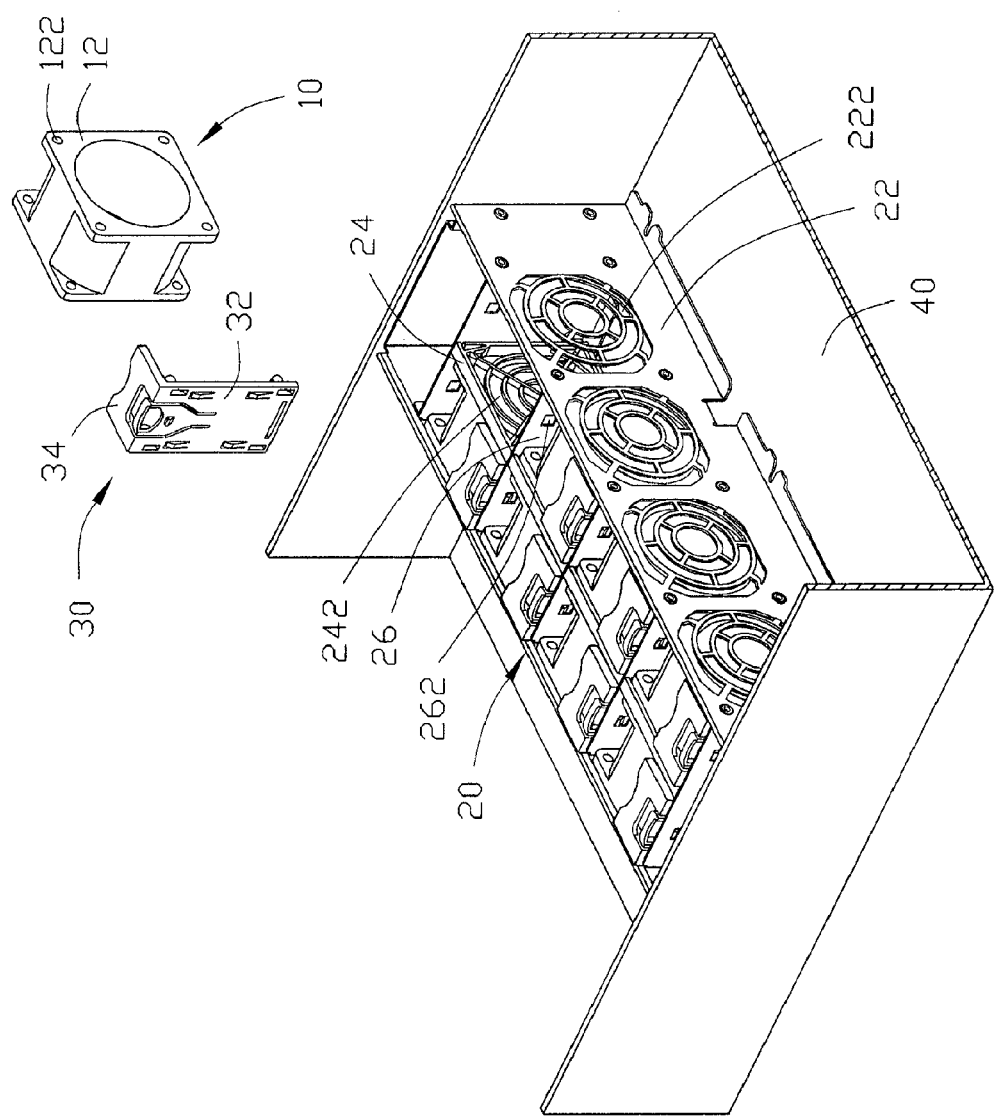
FIG. 1 is an exploded, isometric view of a fan module of a preferred embodiment of the present invention, the fan module including a fan, a bracket mounted into a computer chassis, and a locking member.

Referring to FIG. 1, a fan module of a preferred embodiment of the present invention includes a fan 10, a bracket 20 mounted into a computer chassis 40, and a locking member 30.

The fan 10 includes two parallel side walls 12. Each of the side walls 12 defines a through hole 122 in each corner thereof.

The bracket 20 includes a plurality of holding spaces each receiving the fan 10 therein. Each holding space is enclosed by a front plate 22, a rear plate 24, and a pair of side plates 26. The front plate 22 is parallel to the rear plate 24. The side plates 26 are perpendicular to the front plate 22 and the rear plate 24, respectively. Ventilation holes 222, 242 are respectively defined in the front plate 22 and the rear plate 24, for airflow passing therethrough. A locking hole 262 is defined in each side plate 26.

Figure 2:
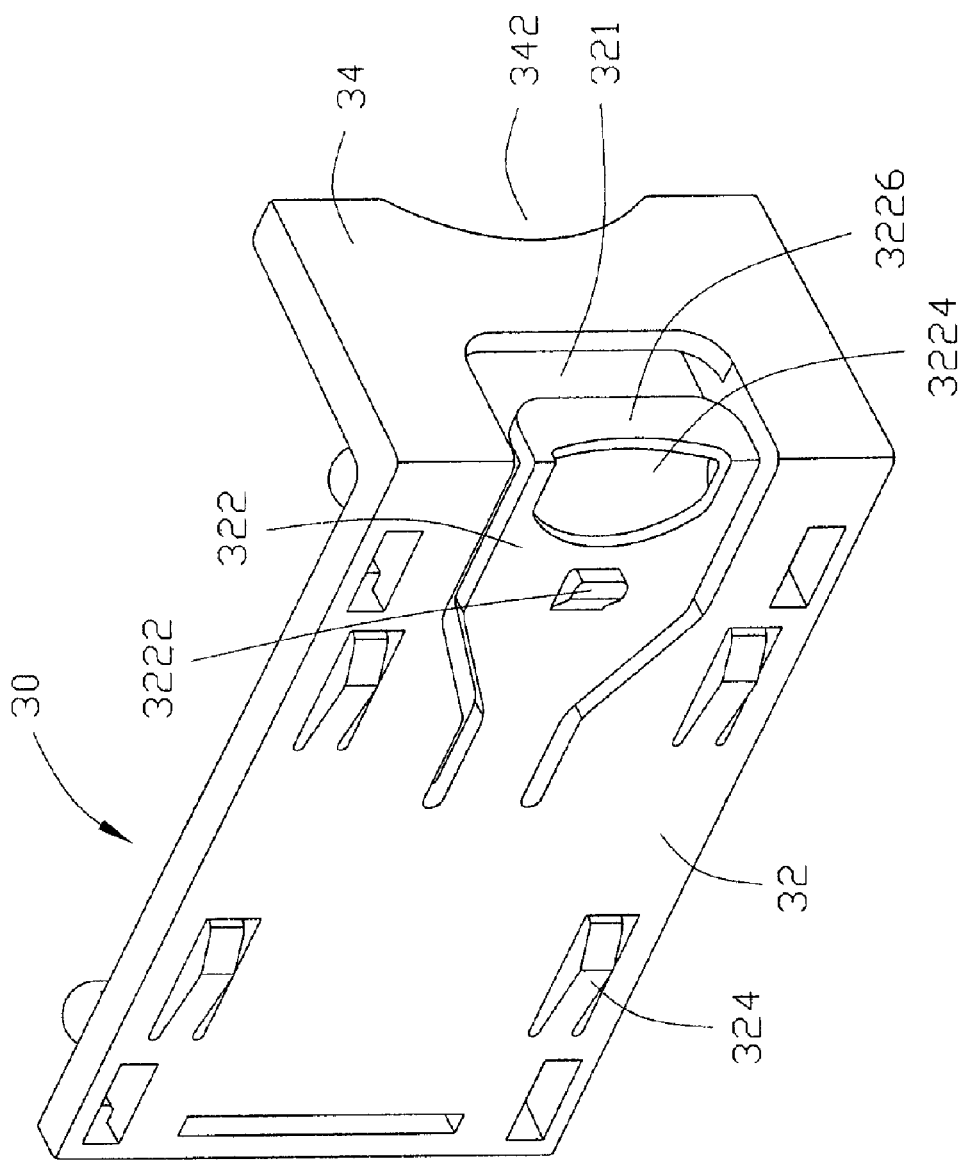
FIG. 2 is another isometric view of the locking member of FIG. 1.
Figure 3:
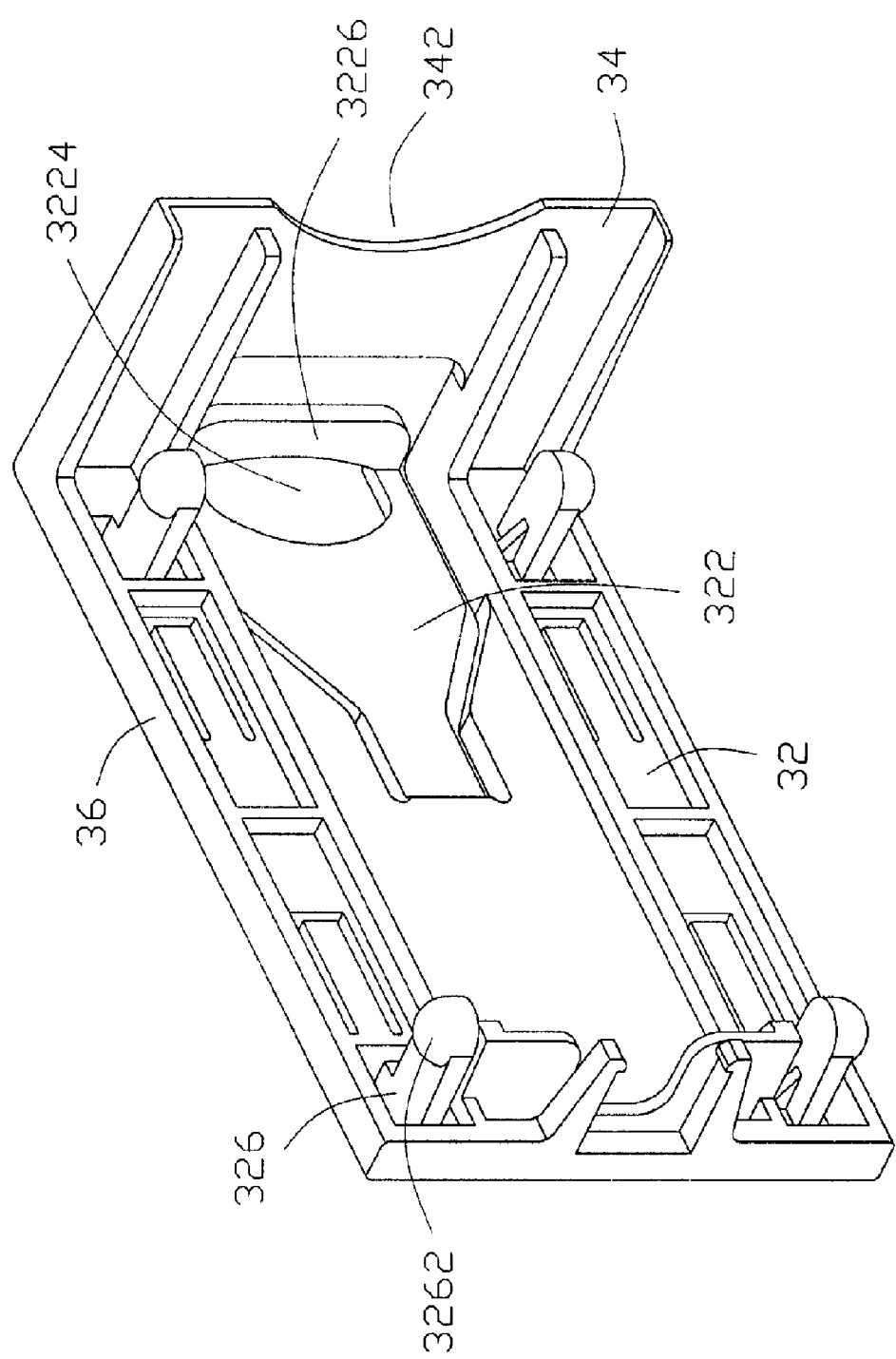
FIG. 3 is another isometric view of the locking member of FIG. 2.

Referring also to FIGS. 2 and 3, the locking member 30 is generally L-shaped, and includes a base portion 32 and an operating portion 34 bent perpendicularly from a top edge of the base portion 32. A holding opening 321 is defined in the base portion 32, and extends into the operating portion 34. A resilient arm 322 extends up from a bottom edge of the holding opening 321. A locking tab 3222 protrudes out from a middle portion of the resilient arm 322. A bent flange 3226 is perpendicularly bent in from a top edge of the resilient arm 322. A through opening 3224 is defined above the locking tab 3222 and extends into the bent flange 3226. Two resilient fingers 324 protrude from adjacent each side edge of an outer surface of the base portion 32. Two posts 326 protrude from both sides of the two resilient fingers 324 at an inner surface of the base portion 32. A hemispherical protrusion 3262 is formed on an outer side of a distal end of each post 326. A protruding flange 36 is formed on each side edge of the locking member 30.

Figure 4:
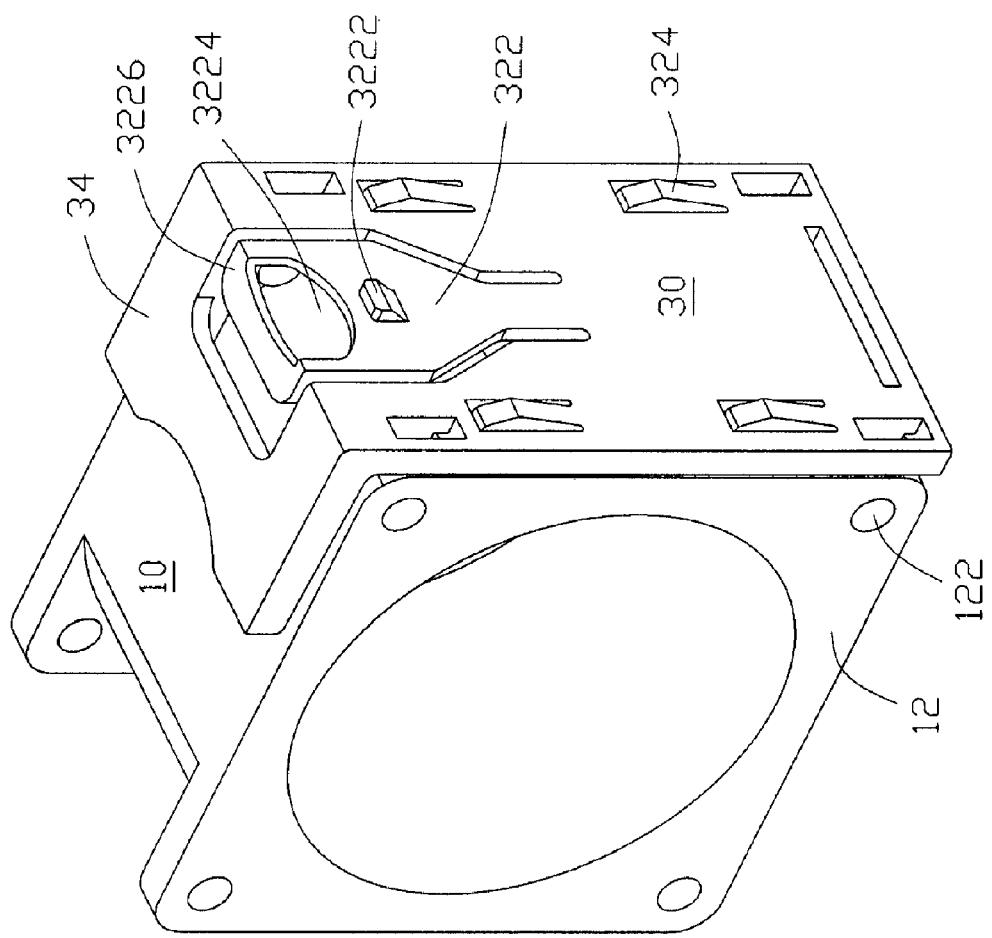
FIG. 4 is an assembled view of the fan and the locking member of FIG. 1.

Before assembling the fan 10 into the holding space of the bracket 20, the locking member 30 is placed on the fan 10 with the base portion 32 located at one side of the fan 10 between the side walls 12 of the fan 10 and the operating portion 34 at another side of the fan 10. The protrusions 3262 of the posts 326 of the locking member 30 are inserted in void between the side walls 12 of the fan 10. The locking member 30 is pushed toward the fan 10, the posts 326 are deformed and thereby inserted into the void between the side walls 12 of the fan 10. When the protrusions 3262 align with the corresponding through holes 122 of the side walls 12 of the fan 10, the posts 326 rebound to insert the protrusions 3262 into the through holes 122. Thus, the fan 10 is assembled together with the locking member 20 (shown in FIG. 4). The protruding flanges 36 of the locking member 30 abut edges of the side walls 12 of the fan 10, a gap is thereby formed between the operating portion 34 of the locking member 30 and the fan 10, for easily operating the operating portion 34 in disassembly of the fan 10.

Figure 5:
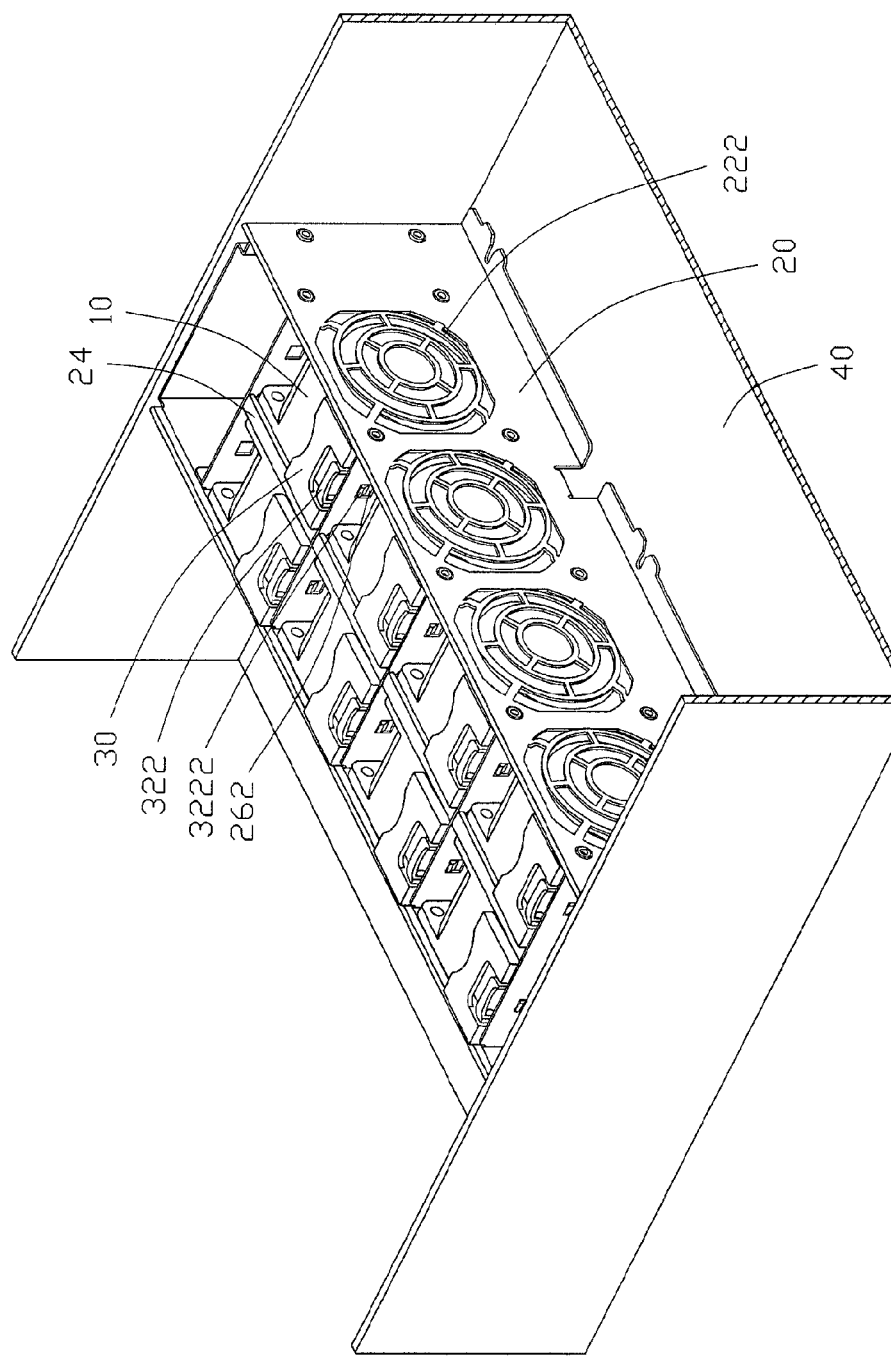
FIG. 5 is an assembled view of FIG. 1, showing the fan and the locking member in a locked position.

In assembling the fan 10 and the locking member 30 in the bracket 20, the fan 10 together with the locking member 30 is inserted into the holding space of the bracket 20. The side plate 26 deforms the resilient arm 322 of the locking member 30 by pressing the locking tab 3222. When the locking tab 3222 aligns with the locking hole 262 of the side plate 26, the resilient arm 322 rebounds. The locking tab 3222 inserts into the locking hole 262 to block the fan 10 and the locking member 30 from sliding out of the holding space. Thus, the fan 10 and the locking member 30 are secured in the holding space of the bracket 30 (shown in FIG. 5).

During the assembly procedure described above, the resilient fingers 324 of the locking member 30 are pressed by the side plate 26. The resilient fingers 324 resiliently deform, and a force is thereby provided securing the fan 10 and the locking member 30 in the holding space of the bracket 20.

After assembly, the base portion 32 of the locking member 30 is sandwiched between the side plate 26 having the locking hole 262, and the fan 10. The side walls 12 of the fan 10 are perpendicular to the side plates 26 of the bracket 20. A direction of airflow through the holding space is generally parallel to the side plates 26 and perpendicular to the front plate 22 and the rear plate 24.

In disassembly of the fan 10 from the bracket 20, the resilient arm 322 is pressed via operation on the bent flange 3226 to disengage the locking tab 3222 from the locking hole 262 of the side plate 26. The fan 10 and the locking member 30 can thus be pulled to slide out of the holding space of the bracket 20 by operating the bent flange 3226 in the through opening 3224 and the operating portion 34 through the cutout 342.

It is to be understood, however, that even though numerous characteristics and advantages have been set forth in the foregoing description of preferred embodiments, together with details of the structures and functions of the preferred embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A fan module comprising:
a fan comprising a pair of parallel side walls each defining at least one through hole therein;
a bracket comprising a pair of parallel side plates for securing the fan therebetween, the side plates being perpendicular to the side walls of the fan, a locking hole being defined in one of the side plates; and
a locking member together with the fan being sandwiched between the fan and one of the side plates of the bracket, the locking member comprising a base portion and an operating portion extending perpendicular from the base portion, a holding opening defined in the base portion and the operating portion, a resilient arm extending from an edge of the holding opening and deformable in the holding opening, at least one pair of resilient posts located on the locking member and positioned between the side walls of the fan, a protrusion being formed on each post removably engaging into the at least one through hole of one corresponding side wall of the fan, a locking tab protruding from the resilient arm and detachably engaging in the locking hole of the side plate of the bracket.

2. The fan module as described in claim 1, wherein each protrusion of the base portion of the locking member is generally hemispherical.

3. The fan module as described in claim 1, wherein the base portion parallel to the side plates of the bracket.

4. The fan module as described in claim 1, wherein a bent flange is bent from a top edge of the resilient arm, and a through opening is defined in the resilient arm and the bent flange, above the locking tab.

5. The fan module as described in claim 4, wherein a cutout is defined in a distal end of the operating portion of the locking member opposite to the base portion.

6. The fan module as described in claim 4, wherein a plurality of resilient fingers is formed on the base portion of the locking member, the resilient fingers abutting against the one of the side plates thereby having the fan stably secured between the side plates of the bracket.

7. A fan module comprising:
a fan;
a bracket comprising a pair of parallel side plates for securing the fan therebetween, a locking hole being defined in one of the side plates; and
a locking member secured on the fan and sandwiched between the fan and the side plate having the locking hole, the locking member comprising a base portion and an operating portion extending perpendicularly from the base portion, a holding opening being defined in the base portion and the operating portion, a resilient arm extending from an edge of the holding opening and being deformable in the holding opening, a locking tab protruding from the resilient arm and detachably engaging in the locking hole of the side plate of the bracket.

8. The fan module as described in claim 7, wherein the resilient arm extends from the base portion to the operating portion.

9. The fan module as described in claim 7, wherein the base portion of the locking member has at least one pair of resilient posts inserting between the side walls of the fan, a protrusion being formed on each post and removably engaging into the at least one through hole of a corresponding side wall of the fan.

10. The fan module as described in claim 9, wherein each protrusion of the base portion of the locking member is generally hemispherical.

11. The fan module as described in claim 7, wherein a bent flange is bent from a top edge of the resilient arm, and a through opening is defined in the resilient arm and the bent flange above the locking tab.

12. The fan module as described in claim 11, wherein a cutout is defined in the operating portion of the locking member opposite to the through opening of the resilient arm.

13. The fan module as described in claim 7, wherein a plurality of resilient fingers is formed on the base portion of the locking member, the resilient fingers abutting against the one of the side plates thereby having the fan stably secured between the side plates of the bracket.

14. The fan module as described in claim 7, wherein the fan comprises a pair of parallel side walls each defining at least one through hole therein, the side walls being perpendicular to the side plates of the bracket.

15. A fan module comprising:
a bracket comprising a pair of parallel plates with a plurality of partition walls connected therebetween to form a plurality of holding spaces, at least one of the partition walls defining a first locking structure;
a plurality of fans respectively secured in the spaces, at least one of the fans comprising a pair of parallel side walls; and
a locking member flexibly secured to the at least one of the fans between the side walls and sandwiched between the at least one of the partition walls and the at least one of the fans, the locking member comprising a base portion and an operating portion extending perpendicular from the base portion, a holding opening defined in the base portion and the operating portion, a resilient arm with a second locking structure protruding from an edge of the holding portion, the resilient arm being deformable in the holding opening, the second locking structure being detachably engaged with the first locking structure to thereby retain the at least one of the fans to a corresponding one of the holding spaces.

16. The fan module as described in claim 15, wherein each of the side walls defines at least one through hole therein, and the locking member forms at least a pair of resilient posts inserted in void between the side walls, a protrusion being formed on each post and removably engaging into the at least one through hole of a corresponding one of the side walls.

17. The fan module as described in claim 15, wherein the operating portion is perpendicular to the partition walls and the plates, the operating portion abuts another side of the at least one of the fans with a gap formed therebetween.

* * * * *